US006182256B1

(12) United States Patent
Qureshi (10) Patent No.: US 6,182,256 B1
(45) Date of Patent: Jan. 30, 2001

(54) SCAN FLIP-FLOP THAT SIMULTANEOUSLY HOLDS LOGIC VALUES FROM A SERIAL LOAD AND A SUBSEQUENT PARALLEL LOAD

(75) Inventor: Fazal Ur Rehman Qureshi, San Jose, CA (US)

(73) Assignee: National Semiconductor Corporation, Santa Clara, CA (US)

( * ) Notice: Under 35 U.S.C. 154(b), the term of this patent shall be extended for 0 days.

(21) Appl. No.: 09/098,236

(22) Filed: Jun. 16, 1998

(51) Int. Cl.[7] ................................................. G01R 31/28
(52) U.S. Cl. .................................................... 714/726
(58) Field of Search .................... 714/726, 724, 714/727, 729

(56) References Cited

U.S. PATENT DOCUMENTS

| | | | |
|---|---|---|---|
| 4,602,210 | * | 7/1986 | Fasang et al. ............... 324/73 R |
| 5,229,657 | * | 7/1993 | Rackley ......................... 307/443 |
| 5,303,246 | * | 4/1994 | Anderson et al. ............... 371/22.3 |
| 5,323,400 | * | 6/1994 | Agarwal et al. ................ 371/22.3 |
| 5,477,545 | * | 12/1995 | Huang ............................ 371/22.3 |
| 5,574,731 | * | 11/1996 | Qureshi ......................... 371/22.3 |
| 5,606,565 | * | 2/1997 | Edler et al. .................... 371/22.3 |
| 5,631,911 | * | 5/1997 | Whetsel, Jr. ................... 371/22.3 |
| 5,726,999 | * | 3/1998 | Bradford et al. ............... 371/22.32 |
| 5,774,003 | * | 6/1998 | Qureshi et al. ................. 327/202 |
| 5,774,475 | * | 6/1998 | Qureshi ......................... 371/22.31 |
| 5,793,778 | * | 8/1998 | Qureshi ......................... 371/22.32 |
| 5,812,562 | * | 9/1998 | Baeg ............................. 371/22.31 |
| 6,014,762 | * | 1/2000 | Sanghani et al. ............... 714/718 |
| 6,023,778 | * | 2/2000 | Li .................................. 714/726 |
| 6,049,901 | * | 4/2000 | Stock et al. .................... 714/726 |

OTHER PUBLICATIONS

"The Boundary–Scan Register" *IEEE Standard Test Access Port and Boundary–Scan Architecture*, (IEEE Std 1149.1–1990), Chapter 10, pp. (10–1) –(10–45), Oct. 21, 1993, New York, NY.

"A.6. Boundary–Scan Register Implementation" *IEEE Standard Test Access Port and Boundary–Scan Architecture*, (IEEE Std 1149.1–1990), Appendix 6, pp. (A–9) –(A–12), Oct. 21, 1993, New York, NY.

* cited by examiner

*Primary Examiner*—Albert De Cady
*Assistant Examiner*—Samuel Lin
(74) *Attorney, Agent, or Firm*—Limbach & Limbach L.L.P.

(57) ABSTRACT

The scan flip-flop that controls a bi-directional or a switchable high-impedance driver is implemented so that, when a logic value on a first input is latched in response to a first clock signal, and a logic value on a second input is latched in response to a second clock signal, both logic values are output during the second clock period.

15 Claims, 13 Drawing Sheets

FIG. 12A CLK

FIG. 12B EN

FIG. 12C OUTPUT FROM FLOP 900

FIG. 12D CNTL

SCAN FLIP-FLOP THAT SIMULTANEOUSLY HOLDS LOGIC VALUES FROM A SERIAL LOAD AND A SUBSEQUENT PARALLEL LOAD

BACKGROUND OF THE INVENTION

1. Field of the Invention

The present invention relates to scan flip-flops and, more particularly, to a scan flip-flop that simultaneously holds a logic value shifted into the flop from a serial load, and a logic value loaded into the flop from a subsequent parallel load.

2. Description of the Related Art

The fundamental approach to testing digital logic at the end of a manufacturing line is to apply a series of logic patterns to the input pins, and then evaluate the logic patterns on the output pins to insure that the proper values are present. The series of logic patterns, in turn, are selected so that every path through the logic is exercised.

While simple in concept, the complexity of this approach increases exponentially as the depth of the logic, i.e., the number of gates between the input and output pins, increases. With deep logic, it is often the case that some portion of the logic can not be exercised by simply applying different patterns to the input pins.

One common technique for limiting the depth of the logic is to use a partitioned logic circuit. With a partitioned logic circuit, special test flip-flops, known as scan flip-flops or scan flops, are chained together at regular intervals to divide the logic circuit into a plurality of logic subcircuits.

Figure 1:
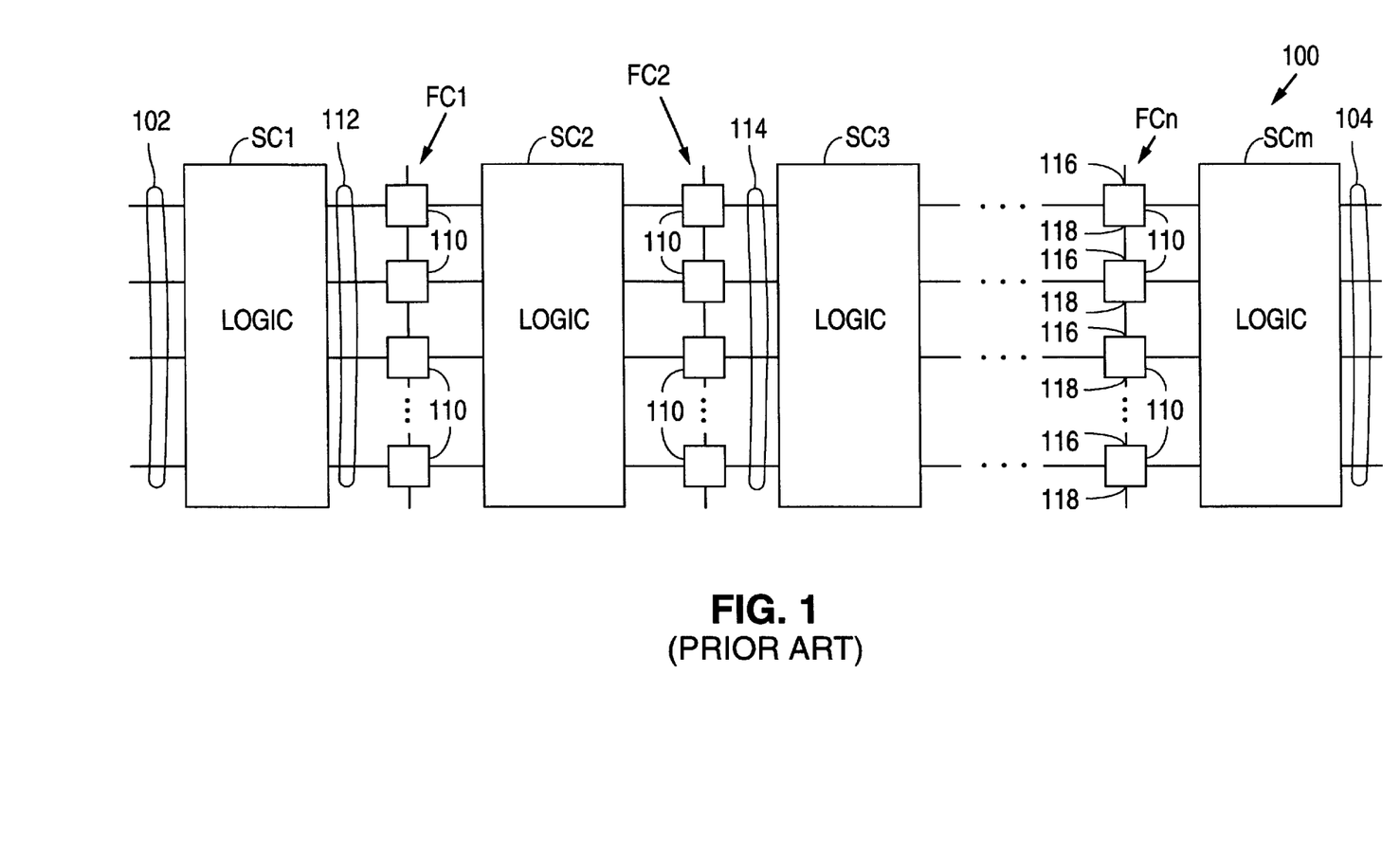
FIG. 1 is a block diagram illustrating a conventional partitioned logic circuit 100.

FIG. 1 shows a block diagram that illustrates a conventional partitioned logic circuit 100. As shown in FIG. 1, logic circuit 100 includes a series of logic subcircuits SC1–SCm, and a series of scan flop chains FC1–FCn which connect the subcircuits SC1–SCm together.

As further shown in FIG. 1, the first logic subcircuit SC1 is connected to a plurality of input pins 102, while the last logic subcircuit SCm is connected to a plurality of output pins 104. Each scan flop chain FC, in turn, is positioned between an adjacent pair of subcircuits SC so that each subcircuit SC, except for the first, has a corresponding input chain, and each subcircuit SC, except for the last, has a corresponding output chain.

For example, flop chain FC1 functions as the output chain for subcircuit SC1, and the input chain for subcircuit SC2, while flop chain FC2 functions as the output chain for subcircuit SC2, and the input chain for subcircuit SC3. (Flop chains are typically not required to input test patterns into the first subcircuit, or to output patterns from the last subcircuit as these functions are provided by the testing equipment).

In addition, each scan flop chain FC includes a plurality of scan flops 110 which each have a parallel input 112, a parallel output 114, a serial input 116, and a serial output 118. As shown, the outputs from a subcircuit SC are connected to the parallel inputs 112 of the flops 110 in the corresponding output chain, while the inputs to a subcircuit SC are connected to the parallel outputs 114 of the flops 110 in the corresponding input chain. Further, the serial inputs and outputs 116 and 118 are utilized to serially connect the flops 110 in a flop chain FC.

Figure 2A:
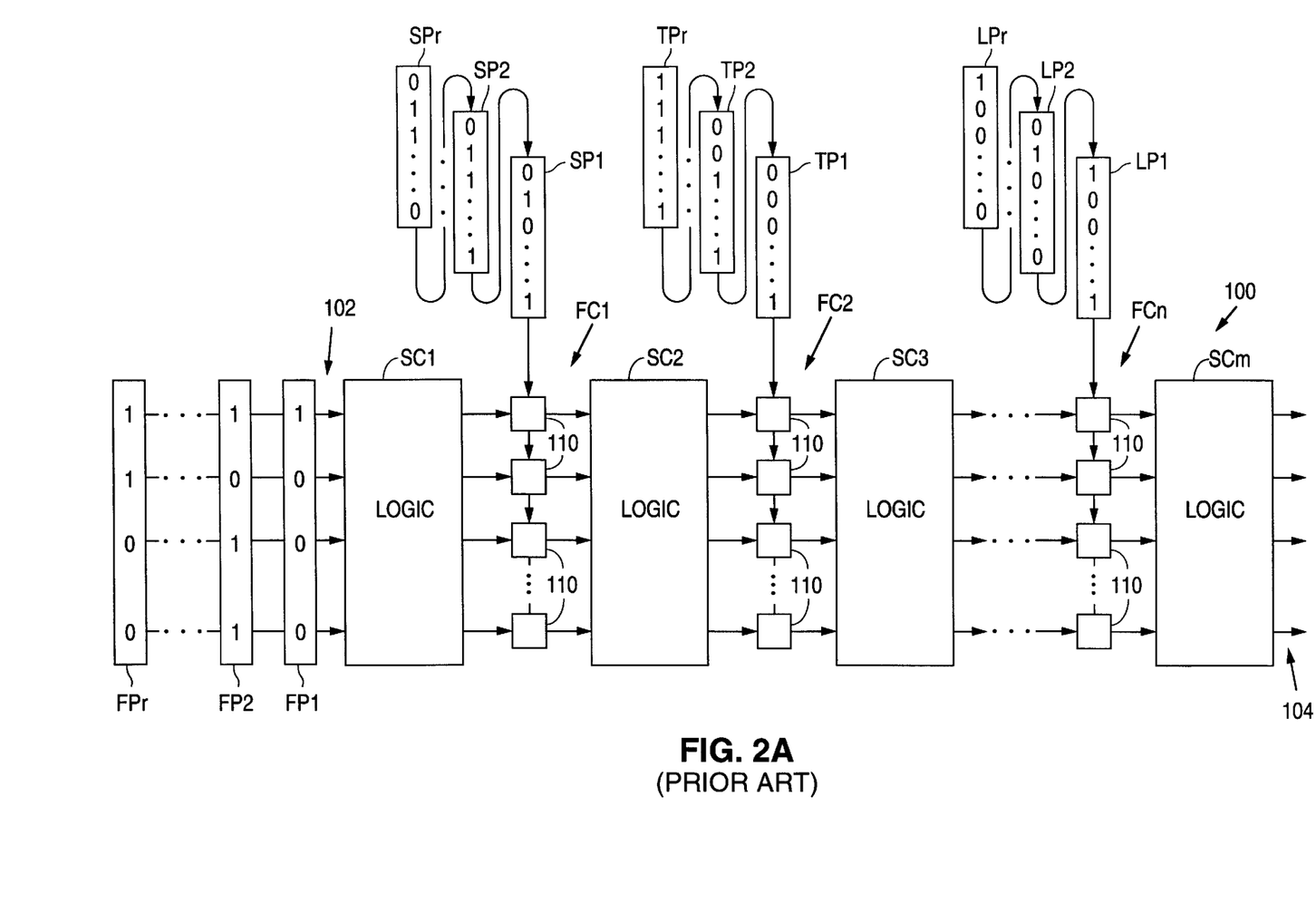
FIGS. 2A–2D are block diagrams illustrating the operation of partitioned logic circuit 100.

FIGS. 2A–2D show block diagrams that illustrate the operation of partitioned logic circuit 100. FIGS. 2A–2D are similar to FIG. 1 and, as a result, utilize the same reference numerals to designate the common structures. FIG. 3 shows a timing diagram that further illustrates the operation of circuit 100.

In operation, logic circuit 100 functions in a logic mode and a test mode. When in the logic mode, logic signals are clocked through the scan flops 110 in a manner which allows logic circuit 100 to function as a single logic device.

Prior to entering the test mode, a series of test patterns is selected for each subcircuit SC so that, when the test patterns are applied to the subcircuits SC, all of the logic paths through the subcircuits SC are exercised. For example, as shown in FIG. 2A, test patterns FP1–FPr, SP1–SPr, TP1–TPr, and LP1–LPr have been selected for subcircuits SC1, SC2, SC3, and SCm, respectively.

When in the test mode, the first test pattern FP1 is presented to the parallel inputs of the first subcircuit SC1, while the first test patterns SP1, TP1, and LP1 are serially loaded into flop chains FC1, FC2, and FCn, respectively.

Figure 2B:
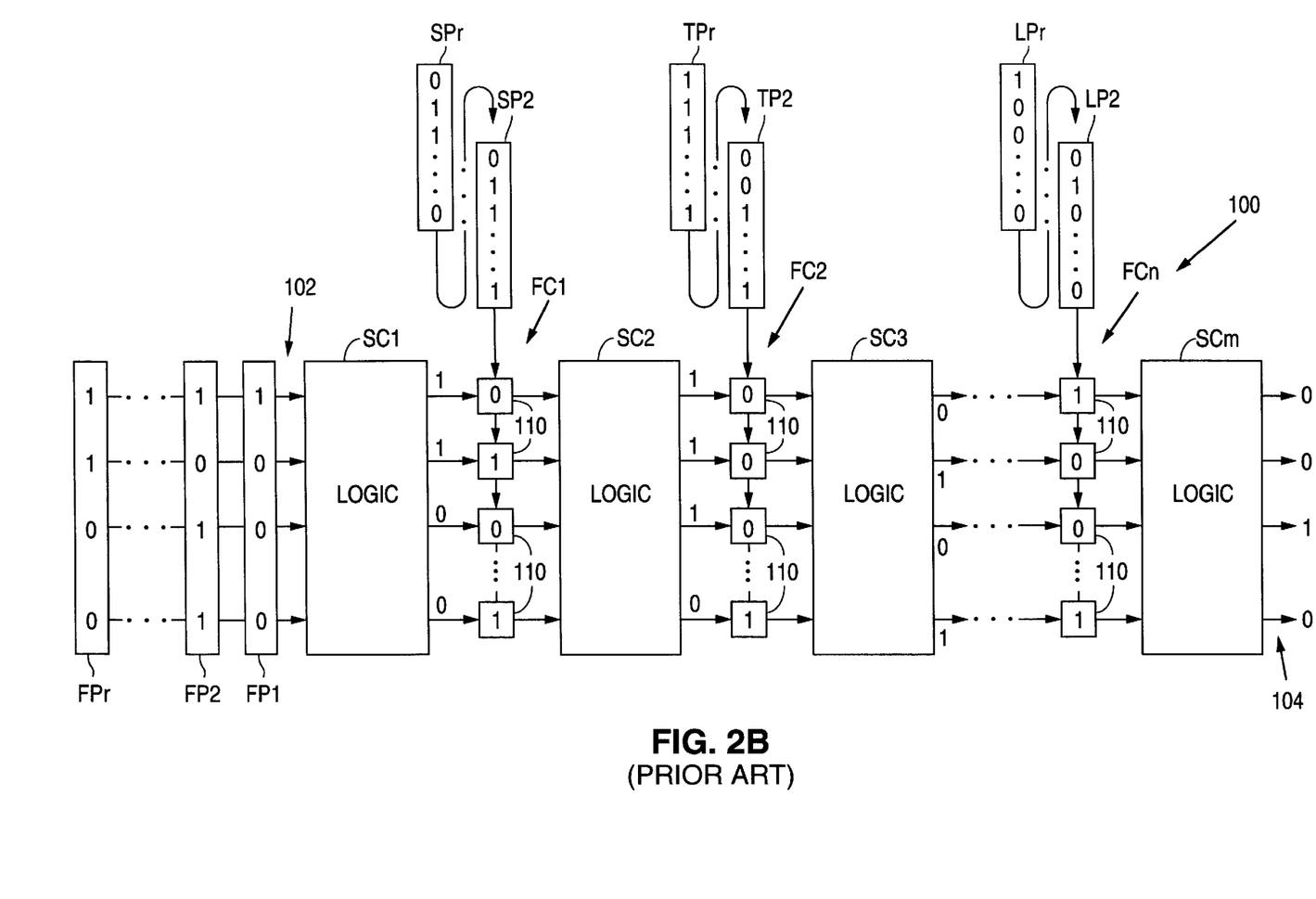
Figure 3:
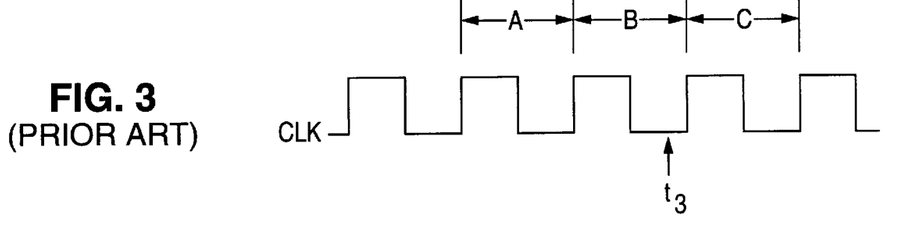
FIG. 3 is a timing diagram further illustrating the operation of circuit 100.

For example, as shown in FIG. 2B, first test pattern [1-0-0- . . . -0] is presented to subcircuit SC1, while first test patterns [0-1-0- . . . -1], [0-0-0- . . . -1], and [1-0-0- . . . -1] are serially loaded into flop chains FC1, FC2, and FCn, respectively.

The last logic values of the first test patterns are serially loaded into the flop chains FC on the rising edge of clock cycle A as shown in FIG. 3. After this, during clock cycle A, each first test pattern propagates through the corresponding subcircuit SC, and causes a first new logic pattern to be presented to the corresponding output chains and the output pins 104.

For example, as further shown in FIG. 2B, first test pattern [1-0-0- . . . -0] , which was presented to subcircuit SC1, causes a first new logic pattern [1-1-0- . . . -0] to be presented to flop chain FC1, while first test pattern [0-1-0- . . . -1], which was loaded into flop chain FC1, causes a first new logic pattern [1-1-1- . . . -0] to be presented to flop chain FC2.

Similarly, first test pattern [0-0-0- . . . -1], which was loaded into flop chain FC2, causes a first new logic pattern [0-1-0- . . . -1] to be output from subcircuit SC3, while first test pattern [1-0-0- . . . -1], which was loaded into flop chain FCn, causes a first new logic pattern [0-0-1- . . . -0] to be output from subcircuit SCm.

Following this, on the rising edge of clock cycle B, which is known as the parallel load cycle, flop chains FC1–FCn latch the first new logic patterns output from subcircuits SC1–SCm via the parallel inputs 112.

Figure 2C:
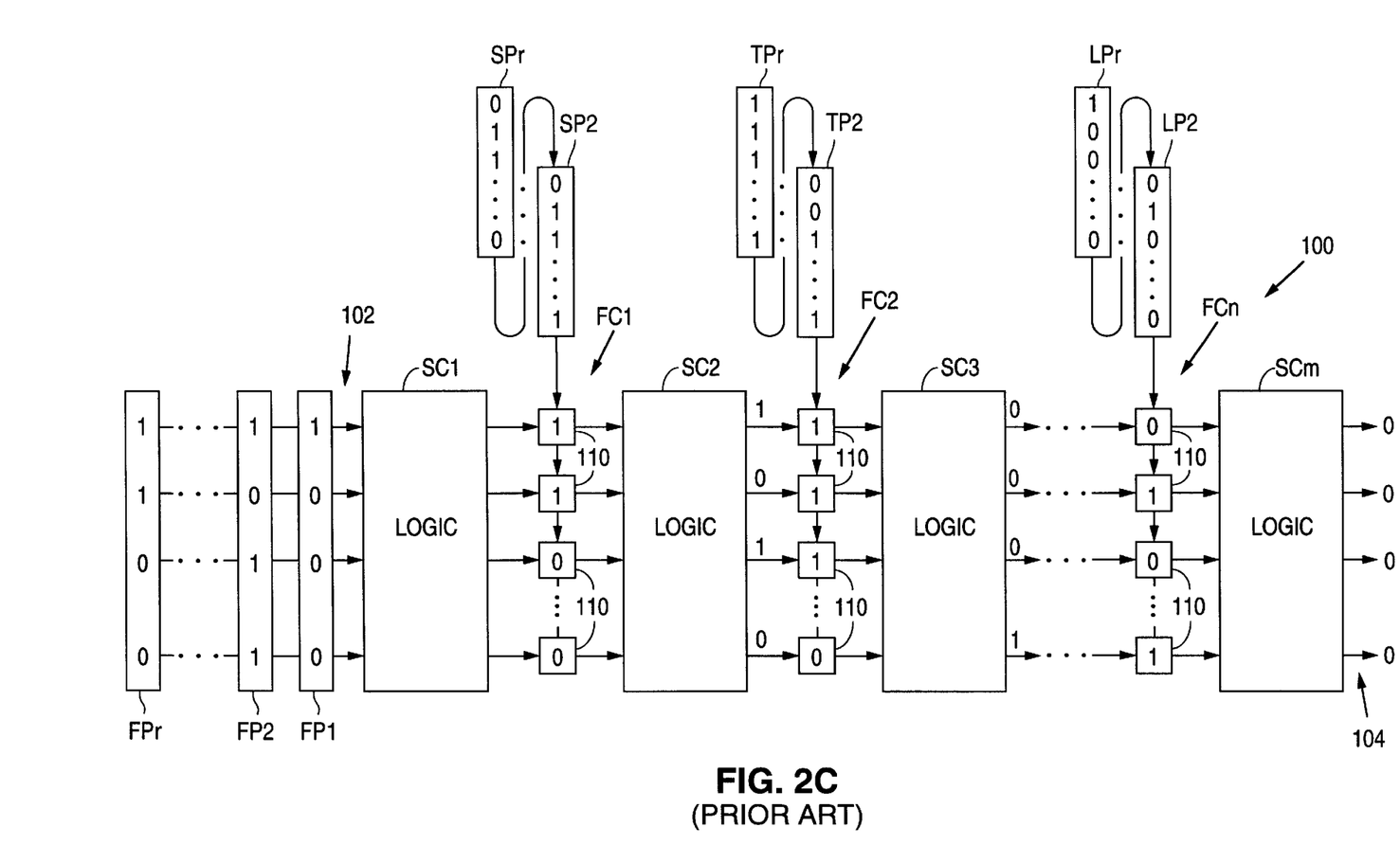

For example, as shown in FIG. 2C, the first new logic pattern [1-1-0- . . . -0] output from subcircuit SC1 is latched by flop chain FC1. Similarly, the first new logic pattern [1-1-1- . . . -0] output from subcircuit SC2 is latched by flop chain FC2, and the first new logic pattern [0-1-0- . . . -1] output from subcircuit SC3 is latched by flop chain FCn (assuming only four subcircuits).

Once latched, these first new logic patterns also propagate through the following logic subcircuits SC, and cause a second new logic pattern to be presented to the parallel inputs 112 of the flop chains FC1–FCn, and output on the output pins 104.

For example, as shown in FIG. 2C, the first new logic pattern [1-1-0- . . . -0] that was latched by flop chain FC1 now causes a second new logic pattern [1-0-1- . . . -0] to be presented to the parallel inputs of flop chain FC2.

Similarly, the first new logic pattern [1-1-1- . . . -0] latched by flop chain FC2 causes a second new logic pattern [0-0-0- . . . -1] to be output from subcircuit SC3, while the first new logic pattern [0-1-0- . . . -1] latched by subcircuit SCm causes a second new logic pattern [0-0-0- . . . -0] to be output to pins 104. (Note that the logic pattern presented at the parallel inputs to flop chain FC1 does not change because the test pattern FP1 has not yet changed).

Next, at time $t_3$ in clock cycle B, the test equipment latches the second new logic pattern output from subcircuit SCm, (e.g., logic pattern [0-0-0- . . . -0]). After this, on the rising edge of clock cycle C, the second test pattern FP2 is presented to the first subcircuit SC1, while the first values of the second test patterns SP2, TP2, and LP2 are serially loaded into flop chains FC1, FC2, and FCn, respectively.

Figure 2D:
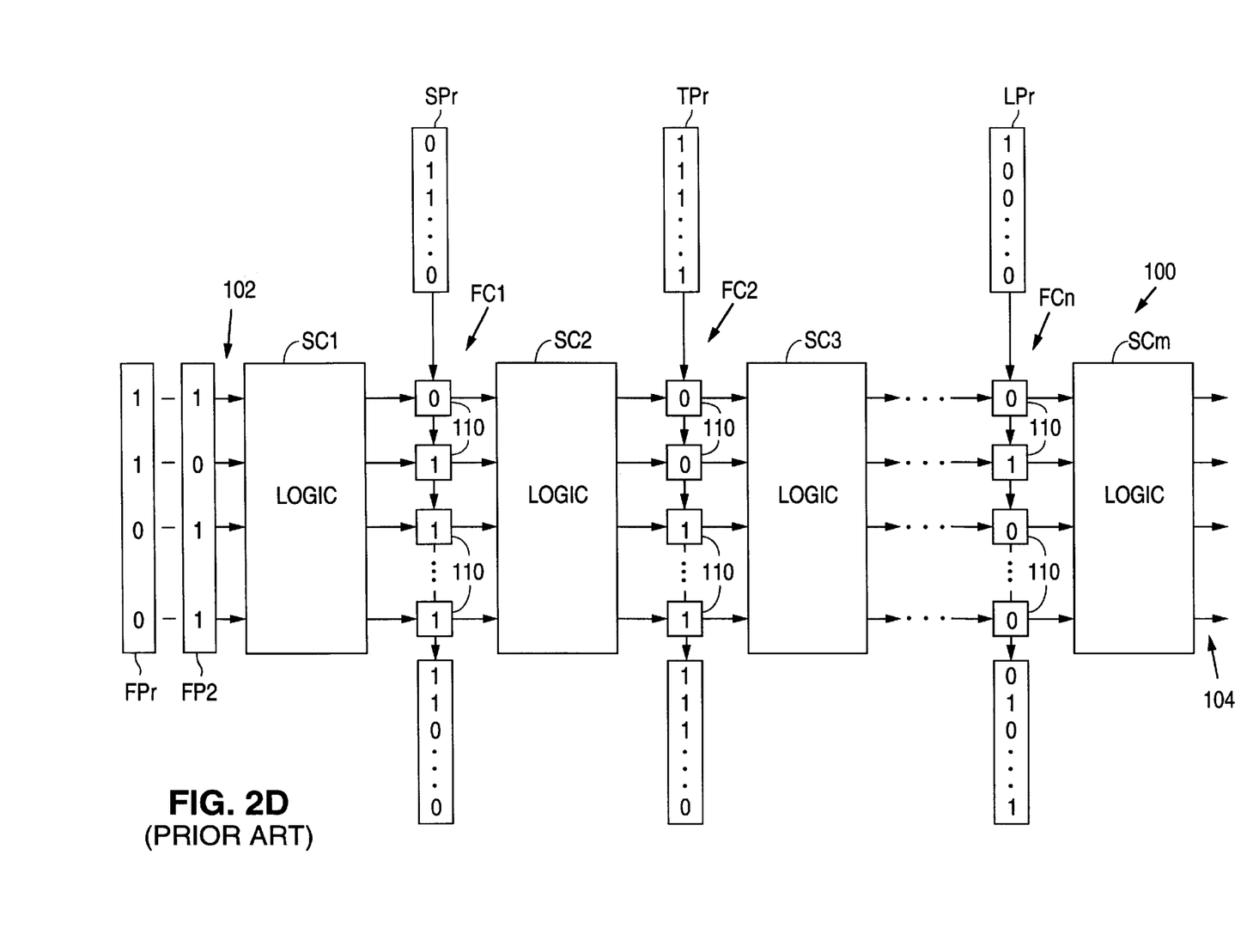

The serial load process continues until second test patterns SP2, TP2, and LP2 are serially loaded into flop chains FC1, FC2, and FCn, respectively. Thus, as shown in FIG. 2D, second test pattern [1-0-1- . . . -1] is presented to subcircuit SC1, while second test patterns [0-0-1- . . . -1], and [0-1-0- . . . -0] are serially loaded into flop chains FC1, FC2, and FCn, respectively.

As each second test pattern is loaded into a flop chain FC, the first new logic patterns which were just latched by the flop chains FC are serially output. Thus, as shown in FIG. 2D, the first new logic pattern [1-1-0- . . . -0] output from subcircuit SC1 is output by flop chain FC1, the first new logic pattern [1-1-1- . . . -0] output from subcircuit SC2 is output by flop chain FC2, and the first new logic pattern [0-1-0- . . . -1] output from subcircuit SC3 is output by flop chain FCn (assuming only four subcircuits).

The first new logic patterns output from the flop chains FC, and the second new logic pattern read from output pins 104 are then compared to the predicted values to determine if the subcircuits SC are functioning correctly.

Figure 4:
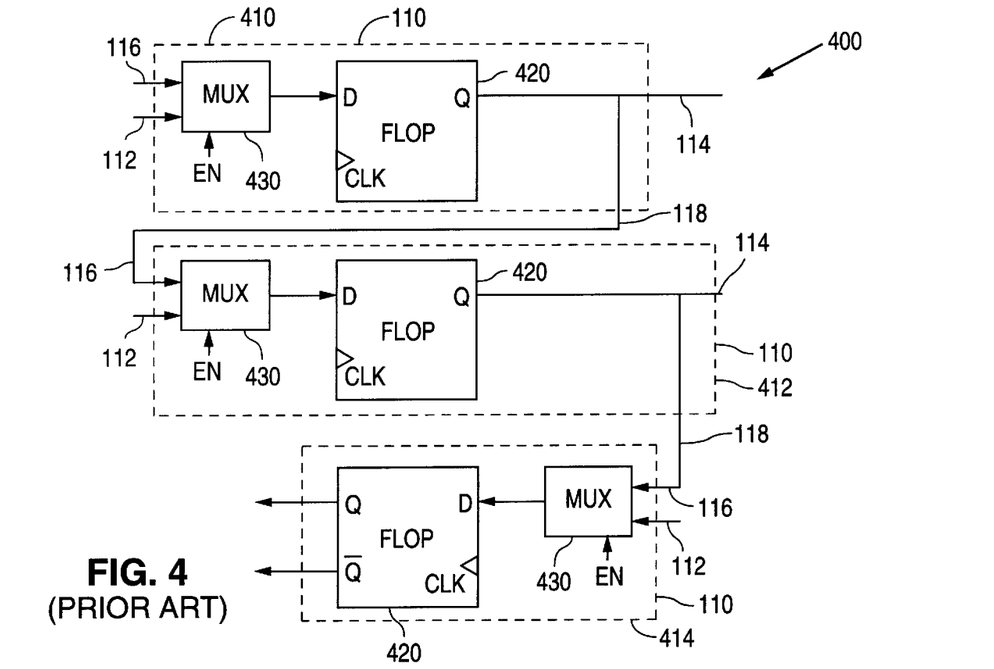
FIG. 4 is a block diagram illustrating a portion of a conventional scan flop chain 400.

FIG. 4 shows a block diagram that illustrates a portion of a conventional scan flop chain 400. As shown in FIG. 4, scan flop chain 400 utilizes three scan flops 110 which include a first flop 410, a second flop 412 which is connected to first flop 410, and a third flop 414 which is connected to second flop 412.

Each scan flop 110/410, 110/412, and 110/414, in turn, includes a D-Q flip-flop 420 which has a D-input, a clock input CLK, and a Q-output; and a two-to-one multiplexor 430 which has a parallel input 112, a serial input 116, a select input that receives a test enable signal EN, and a mux output connected to the D input of flop 420.

As further shown in FIG. 4, scan flops 110/410, 110/412, and 110/414 are chained together by simply connecting the Q-output of one scan flop 110 to the serial input of the next scan flop 110 in the chain, and by connecting each of the mux select inputs.

In addition, FIG. 4 also shows that the first and second scan flops 410 arid 412 receive signals from the left-side of the drawing, and output signals to the right-side of the drawing, while the third scan flop 414 receives signals from the right-side of the drawing, and outputs signals to the left-side of the drawing.

When in the test mode, a test pattern is serially shifted into the chain by setting the test enable signal EN to a logic state that selects the serial inputs of the flops in the chain. Thus, since the outputs of each flop 110 (except the last) is connected to the serial input of the next flop 110, patterns are serially loaded by simply clocking the values into the chain.

One problem with scan testing is that, when bidirectional and switchable high-impedance I/O circuits are used, the input and output states of the pins associated with these circuits can not be determined ahead of time.

The reason the input and output states of the pins can not be determined ahead of time is that a flop, such as flop 412 of circuit 400, is used to control the input and output states of the pins, and the value which is loaded into the flop during the serial load (which sets the input or output state of the pin) may be changed by the value that is loaded into the flop during the parallel load (the rising edge of clock cycle B in FIG. 3).

Conventionally, the tester must place test patterns on the input pins prior to the rising edge of clock cycle B in FIG. 3. If on the rising edge of clock cycle B a pin changes from an input to an output pin, the test equipment will drive a value onto the pin when a value should be read from the pin. This, in turn, leads to a testing failure.

Figure 5:
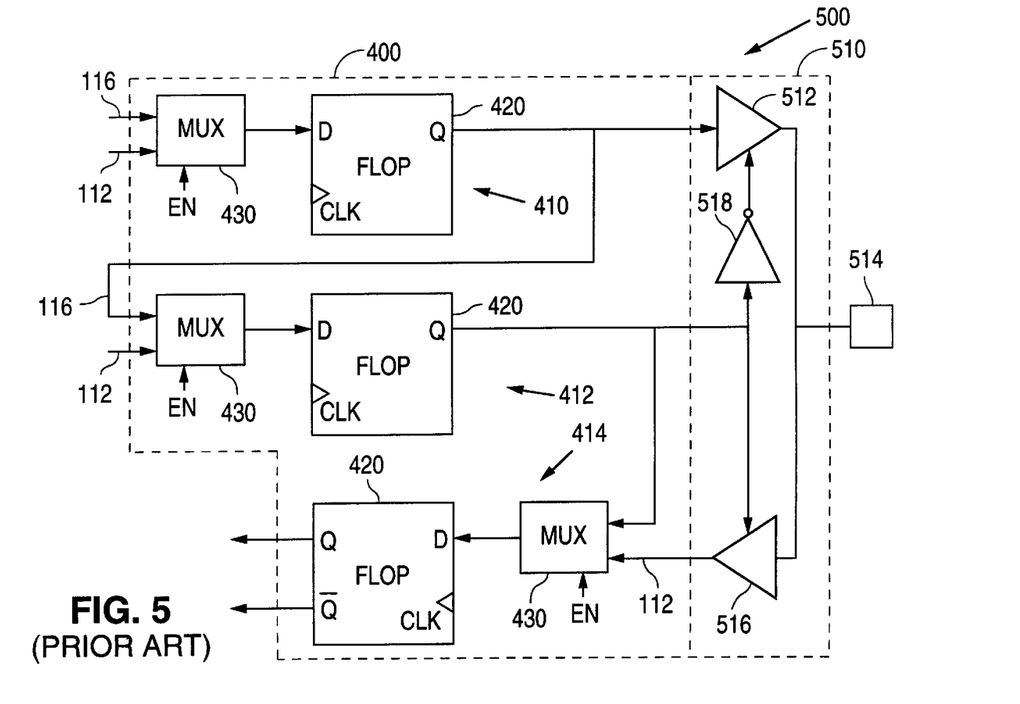
FIG. 5 is a block diagram illustrating a portion of a conventional partitioned logic circuit 500.

FIG. 5 shows a block diagram that illustrates a portion of a conventional partitioned logic circuit 500. FIG. 5 is similar to FIG. 4 and, as a result, utilizes the same reference numerals to designate the common structures. As shown in FIG. 5, circuit 500 includes scan flop chain 400 of FIG. 4, and a bi-directional circuit 510 which functions as a logic subcircuit, such as subcircuit SCm of FIG. 1.

As further shown in FIG. 5, bi-directional circuit 510 includes an output driver 512 which has an input connected to the Q output of scan flop 410, and an output connected to a bi-directional pin 514.

In addition, circuit 510 also includes an input driver 516 which has an input connected to bidirectional pin 514, and an output connected to the parallel input of scan flop 414. Further, an inverter 518 has an output connected to a control input of output driver 512, and an input connected to a control input of input driver 516 and the Q output of scan flop 412.

Figure 6A:
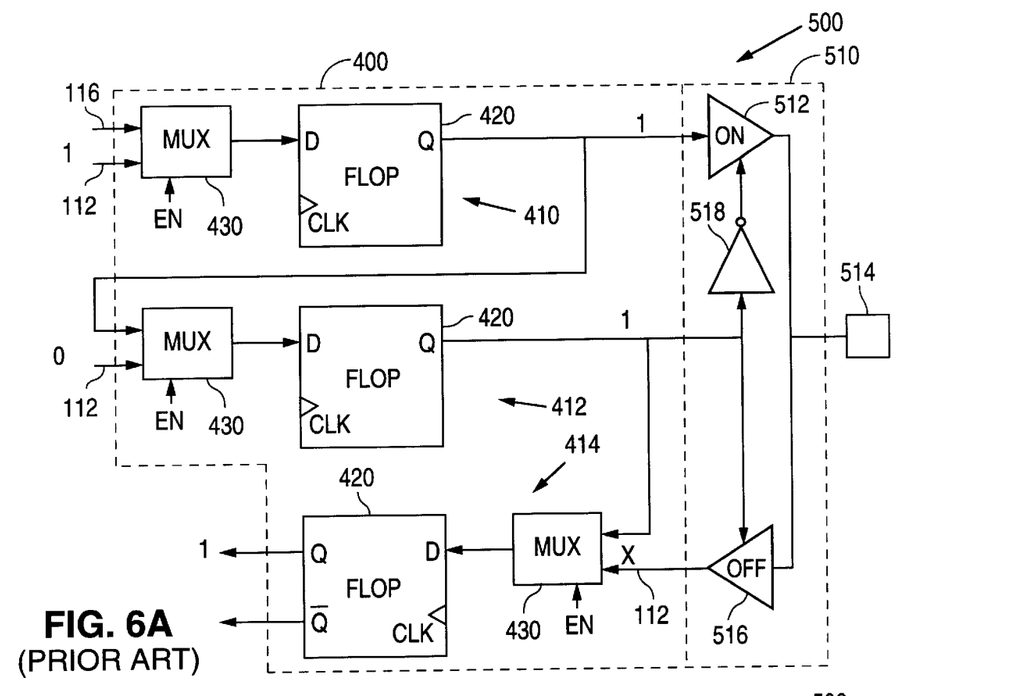
FIGS. 6A–6B are block diagrams illustrating the operation of circuit 500.
Figure 6B:
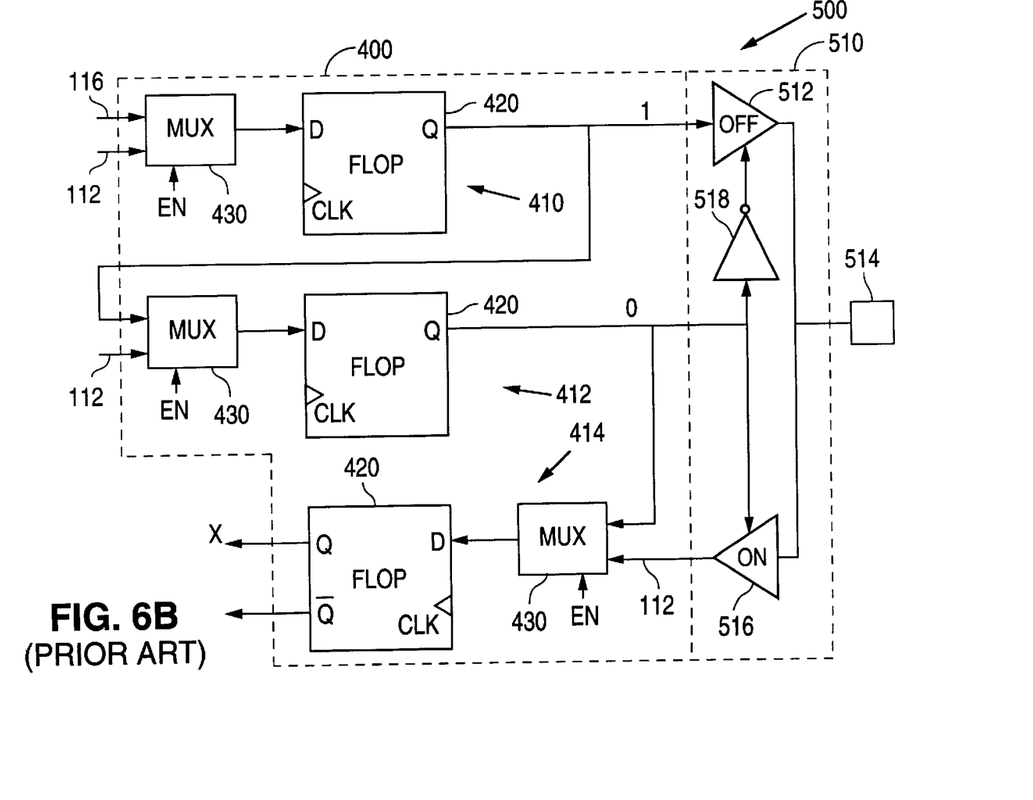
Figure 7A:
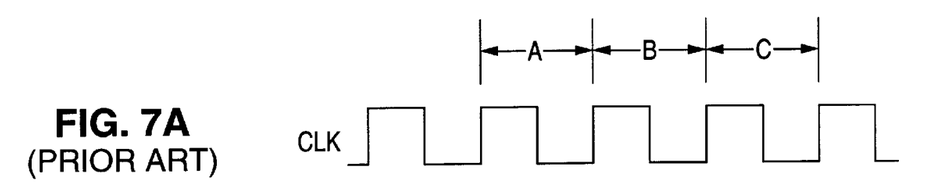
FIGS. 7A–7C show timing diagrams further illustrating the operation of circuit 500.
Figure 7B:
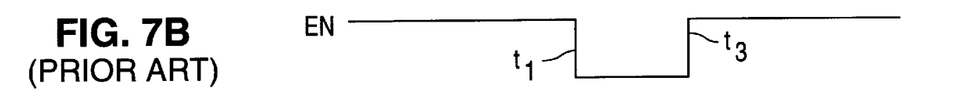
Figure 7C:
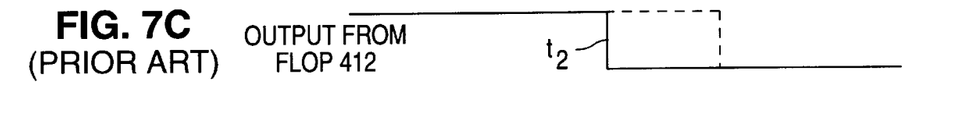

FIGS. 6A–6B show block diagrams that illustrate the operation of circuit 500. FIGS. 6A–6B are similar to FIG. 5 and, as a result, utilize the same reference numerals to designate the common structures. FIGS. 7A–7C show timing diagrams that further illustrate the operation of circuit 500.

In operation, as shown in FIGS. 6A and 7A–7C, during the serial loading of a first test pattern [1-1-1] into flop chain 400, a test enable signal EN, which is applied to the mux select inputs, is set to a logic high to select the serial inputs.

The last value of the first test pattern [1-1-1] is then shifted into flop chain 400 on the rising edge of clock cycle A. (Note in FIG. 6A that logic highs are output from flops 410, 412, and 414). The logic one output by second flop 412 turns on output driver 512 and turns off input driver 516.

Thus, based on a logic one being shifted into flop 412, the test equipment expects bi-directional pin 514 to be an output pin.

In addition, as a result of a first test pattern being shifted into the flop chain that precedes flop chain 400, a new logic pattern [1-0] is presented to the parallel inputs of flops 410 and 412. Since the test equipment expects bi-directional pin 514 to be an output pin, the logic value presented to the parallel input of flop 414 is a don't care.

Following this, at time $t_1$ in clock cycle A, the test enable signal EN falls to a logic low which selects the parallel inputs of multiplexors 430. Next, on the rising edge of clock cycle B, flop chain 400 latches the new logic pattern [1-0].

As shown in FIGS. 7A–7C, once the new logic pattern has been latched by flop 412, the output from flop 412 falls to a logic low at time $t_2$. Thus, the logic low now output from scan flop 412 turns off output driver 512 and turns on input driver 516.

As a result, bi-directional pin 514 has been changed from an output pin to an input pin. This change in the direction of pin 514, however, can not be detected by the test equipment as the test equipment is only aware of the values that have been serially loaded into chain 400.

Thus, the test equipment expects the output from flop 412 to remain high (as shown by the dashed line in FIG. 7C), and to read a logic value from pin 514 at time $t_3$ (which is the same as time $t_1$ in FIG. 3). At the same time, however, the output from flop 412 has fallen, thereby reconfiguring pin 514 to be an input pin. This indeterminate state, in turn, causes a testing error.

Figure 8:
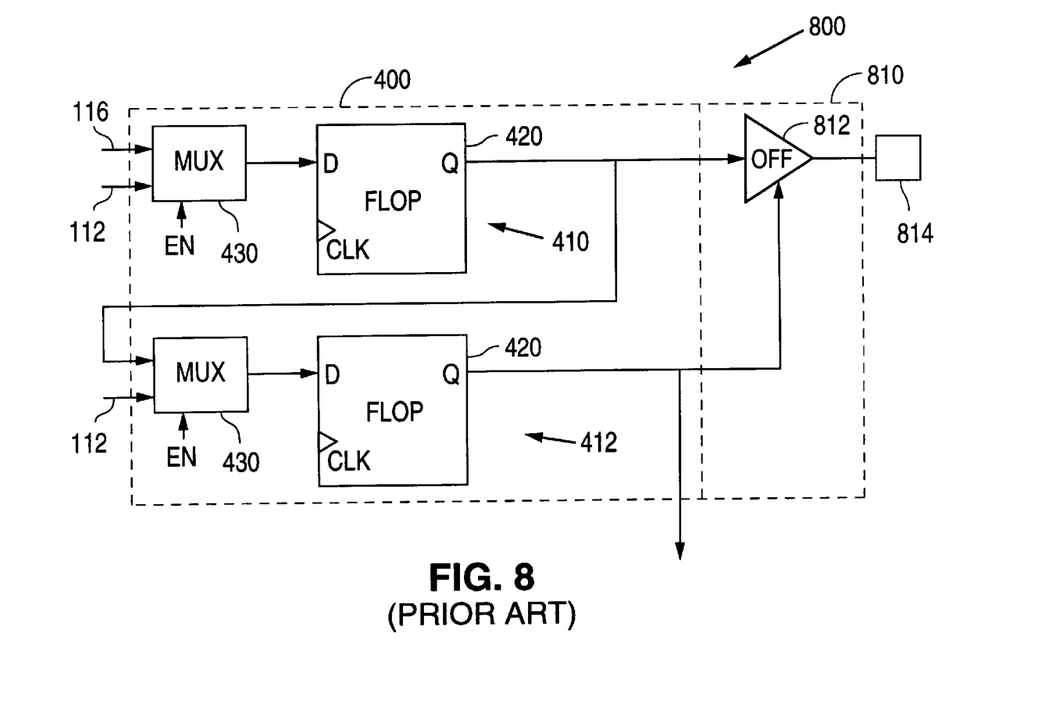
FIG. 8 is a block diagram illustrating a portion of a conventional partitioned logic circuit 800.

Similar errors occur when a switchable high-impedance circuit, such as a TRI-STATE™ circuit, is used. FIG. 8 shows a block diagram that illustrates a portion of a conventional partitioned logic circuit 800. As shown in FIG. 8, circuit 800 includes a portion of scan flop chain 400 of FIG. 4, and a switchable high-impedance circuit 810 which functions as a logic subcircuit, such as subcircuit SCm of FIG. 1. As shown, FIG. 8 is similar to FIG. 4 and, as a result, utilizes the same reference numerals to designate the common structures.

As further shown in FIG. 8, circuit 800 includes a driver 812 which has an input connected to the Q output of scan flop 410, an output connected to a switchable high-impedance pin 814, and a control input connected to the Q output of scan flop 412.

In operation, the logic state output from flop 412 determines the state of pin 814 in a similar way that the logic state output from flop 412 determines the state of pin 514 in FIGS. 6A and 6B. Thus, as with bi-directional pins, if the test equipment expects the output from flop 412 to remain high at the same time that the output from flop 412 has fallen, thereby reconfiguring pin 814, a testing error will result.

Thus, there is a need for a testing arrangement that guarantees the pin directions for a whole cycle.

SUMMARY OF THE INVENTION

Conventionally, the scan flip-flop that controls a bi-directional or a switchable high-impedance driver circuit first controls the circuit by outputting the logic state that was shifted into the flop from the serial input, and then controls the circuit by outputting the logic state that is next loaded into the flop from the parallel input. Problems arise when these two logic states differ.

In the present invention, the scan flip-flop controls a bi-directional or a switchable high-impedance driver so that, when a logic value on a first input is latched in response to a first clock signal, and a logic value on a second input is latched in response to a second clock signal, both logic values are output during the second clock period.

A scan flip-flop in accordance with the present invention includes first and second latches which both have an input and an output, and three multiplexors. The first multiplexor has a serial input, a parallel input, a select input, and an output connected to the input of the first latch.

The second multiplexor has a serial input connected to the serial input of the first multiplexor, a flop input connected to the output of the first latch, a select input connected to the select input of the first multiplexor, and an output connected to the input of the second latch.

The third multiplexor has an input connected to the output of the first latch, an input connected to the output of the second latch, a control input, and an output.

In operation, the scan flip-flop latches a serial-test logic state on the serial inputs in response to a first clock signal, and outputs the serial-test logic state via the output of the third multiplexor, when a test enable signal on the select input selects the serial input.

In addition, the scan flip-flop also latches a parallel-test logic state on the parallel input in response to a second clock signal, and outputs the parallel-test logic state via the output from the first latch when the test enable signal is switched to select the parallel input, and a control signal on the control input is in a second of two logic states.

Further, in accordance with the present invention, a scan chain includes a first scan flipflop and a second scan flip-flop. The first scan flip-flop includes a latch that has an input and an output, and a multiplexor that has a serial input, a parallel input, a select input, and an output connected to the input of the latch.

The second scan flip-flop includes first and second latches that both have an input and an output, and three multiplexors. The first multiplexor has a serial input connected to the output of the latch of the first scan flip-flop, a parallel input, a select input connected to the select input of the first scan flip-flop, and an output connected to the input of the first latch of the second scan flip-flop.

The second multiplexor has a serial input connected to the serial input of the first multiplexor of the second scan flip-flop, a flop input connected to the output of the first latch of the second scan flip-flop, a select input connected to the select input of the first multiplexor, and an output connected to the input of the second latch of the second scan flip-flop. The third multiplexor has an input connected to the output of the first latch of the second scan flip-flop, an input connected to the output of the second latch of the second scan flip-flop, a select input, and an output.

A better understanding of the features and advantages of the present invention will be obtained by reference to the following detailed description and accompanying drawings which set forth an illustrative embodiment in which the principals of the invention are utilized.

DETAILED DESCRIPTION

Figure 9:
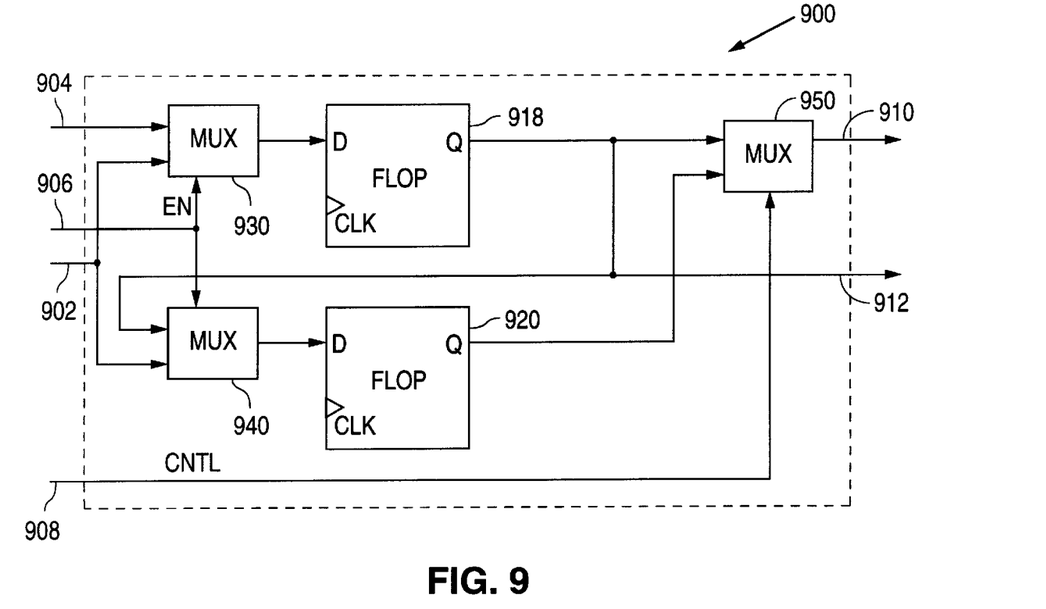
FIG. 9 is a circuit diagram illustrating a scan flop 900 in accordance with the present invention.

FIG. 9 shows a circuit diagram that illustrates a scan flip-flop 900 in accordance with the present invention. As described in greater detail below, the scan flop of the present invention simultaneously outputs the logic state latched from a serial input on one clock cycle, and the logic state latched from a parallel input on a next clock cycle.

As shown in FIG. 9, scan flop 900 has a serial input 902, a parallel input 904, a select input 906, a control input 908, a first output 910, and a second output 912.

In operation, when a test enable signal EN on select input 906 and a control signal CNTL on control input 908 are both in a second logic state, flop 900 latches a test value on serial input 902 which, in turn, is output onto first output 910 and second output 912.

When the test enable signal EN is then set to a first logic state, and the control signal CNTL remains in the second logic state, flop 900 latches a test value on parallel input 904 which, in turn, is output on second output 912.

Thus, a serial test value and a parallel test value are output from outputs 910 and 912, respectively, at the same time. (The benefits of simultaneously outputting a serial test value and a parallel test value will become clear when scan flop 900 is incorporated into a flop chain that is connected to a bi-directional or switchable high impedance pin).

As shown in FIG. 9, scan flop 900 further includes two D-Q flip-flops 918 and 920 which each have a D-input, a clock input CLK, and a Q output. In addition, scan flop 900 also includes three two-to-one multiplexors 930, 940, and 950.

Multiplexor 930 has a serial input connected to serial input 902, a parallel input connected to parallel input 904, a select input connected to select input 906, and a mux output connected to the D input of flop 918.

Similarly, multiplexor 940 has a serial input connected to serial input 902, a flop input connected to the Q output of flop 918, a select input connected to select input 906, and a mux output connected to the D input of flop 920.

Multiplexor 950, in turn, has a first mux input connected to the Q output of flop 918, a second mux input connected to the Q output of flop 920, a select input connected to control input 908, and a mux output connected to first output 910. The Q output from flop 918 forms second output 912. (Although the present invention is described with respect to D-Q flip-flops, those skilled in the art will readily understand that other latches may alternately be used).

Figure 10:
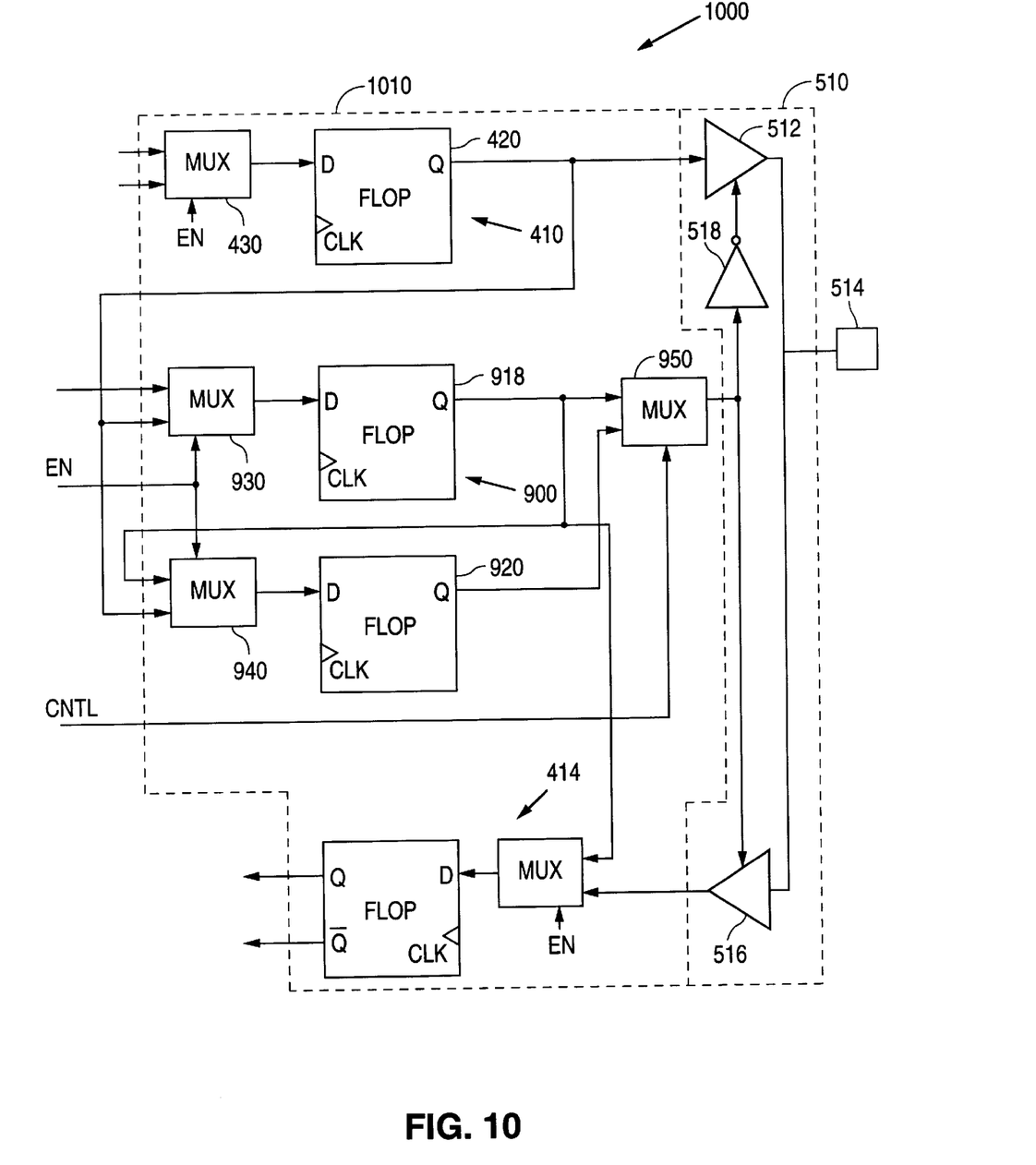
FIG. 10 is a block diagram illustrating a portion of a logic circuit 1000 in accordance with the present invention.

FIG. 10 shows a block diagram that illustrates a portion of a logic circuit 1000 in accordance with the present invention. As shown in FIG. 10, circuit 1000 includes a scan flop chain 1010, and the bi-directional circuit 510 of FIG. 5 which functions as a logic subcircuit, such as subcircuit SCm of FIG. 1.

As further shown in FIG. 10, scan flop chain 1010 includes scan flop 410 of FIG. 4 which is connected to circuit 510, scan flop 900 of FIG. 9 which is connected to scan flop 410 and circuit 510, and scan flop 414 of FIG. 4 which is connected to scan flop 900 and circuit 510.

Figure 11A:
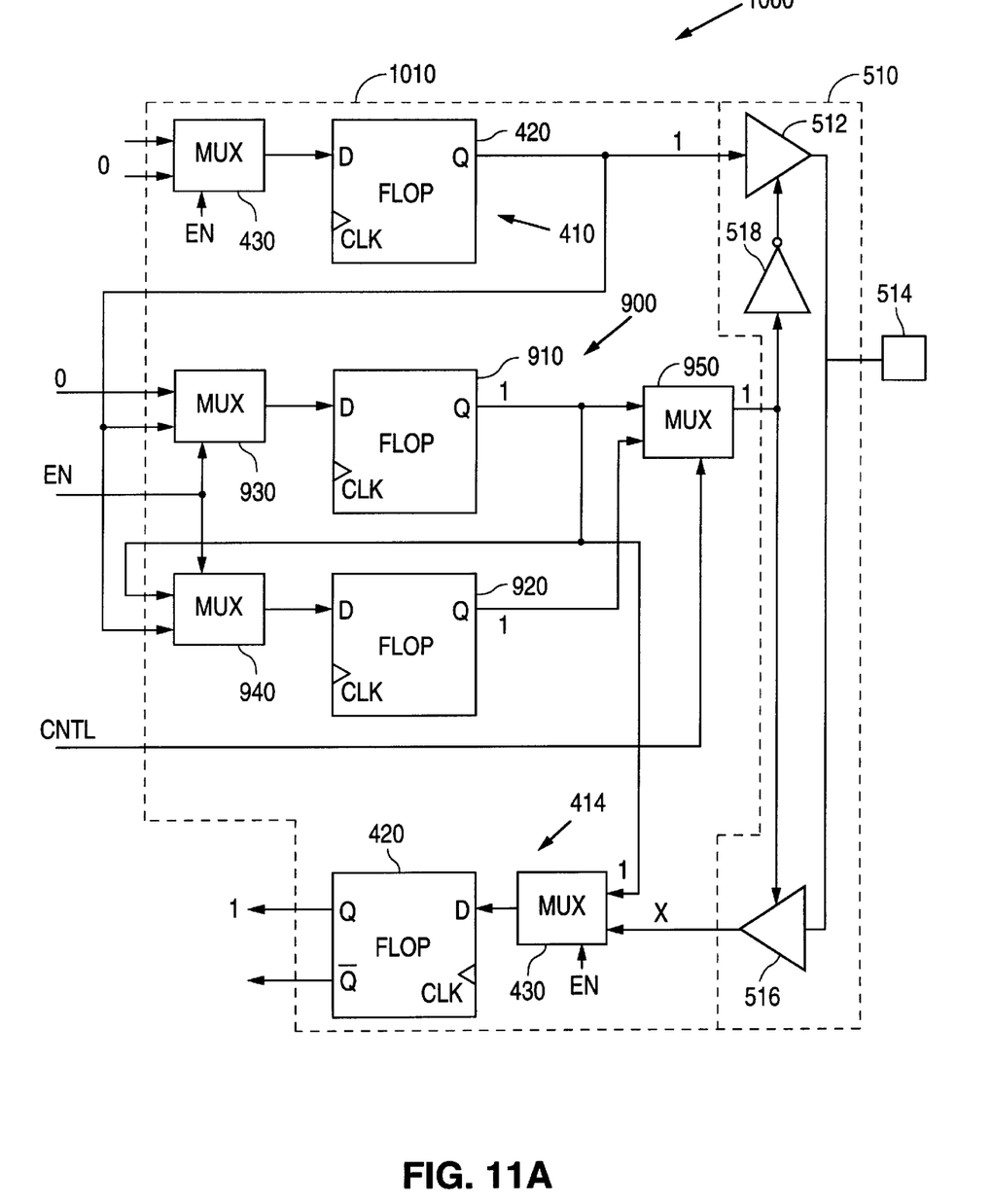
FIGS. 11A–11B are block diagrams illustrating the operation of circuit 1000.
Figure 11B:
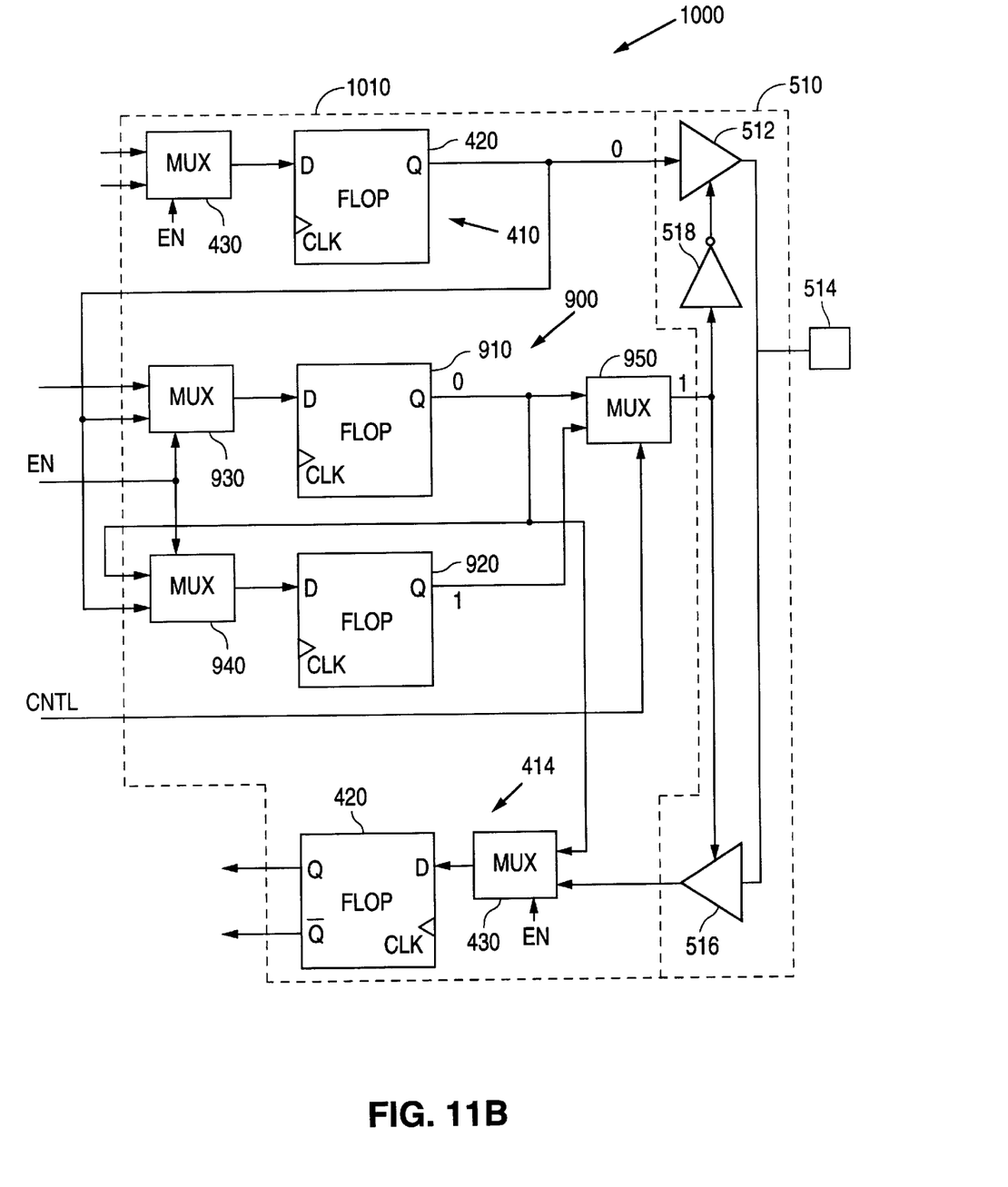
Figure 12A:
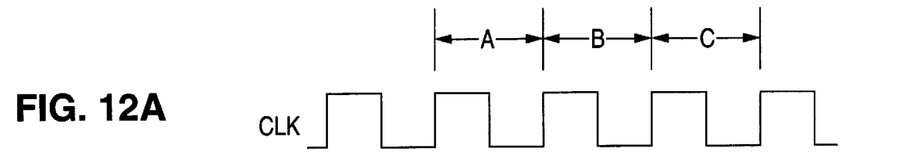
FIGS. 12A–12D are timing diagrams further illustrating the operation of circuit 1000.
Figure 12B:
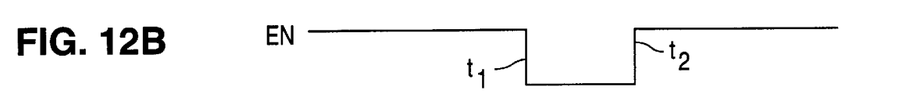
Figure 12C:
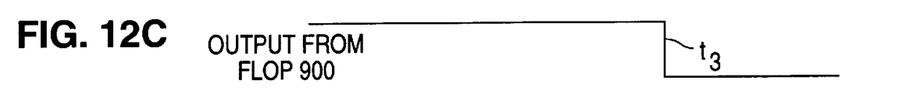
Figure 12D:
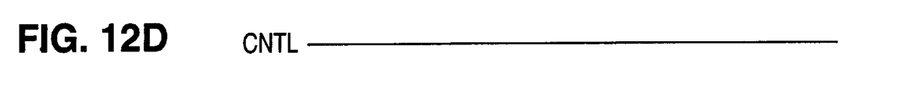

FIGS. 11A–11B show block diagrams that illustrate the operation of circuit 1000. FIGS. 11A–11B are similar to FIG. 10 and, as a result, utilize the same reference numerals to designate the common structures. FIGS. 12A–12D show timing diagrams that further illustrate the operation of circuit 1000.

In operation, as shown in FIGS. 11A and 12A–12D, during the serial loading of flop chain 1010, the test enable signal EN is set to a logic high to select the serial inputs of scan flops 410, 900, and 414. In addition, the control signal CNTL is set to a logic high to select the output from flop 920.

At the end of the serial shift cycle, the last value of a first test pattern [1-1-1] is shifted into flop chain 1010 on the rising edge of clock cycle A. (Note in FIG. 11A that logic highs are output from flops 410, 900, and 414).

The logic one output by scan flop 900 turns on output driver 512 and turns off input driver 516. Thus, based on a logic one being shifted into flop 900, the test equipment expects bi-directional pin 514 to be an output pin.

In addition, as a result of a first test pattern being shifted into the flop chain that precedes flop chain 1010, a new logic pattern [0-0] is presented at the parallel inputs of flops 410 and 900. Since the test equipment expects bi-directional pin 514 to be an output pin, the logic value presented to the parallel input of flop 414 is a don't care.

Following this, at time $t_1$ in clock cycle A, the test enable signal EN falls to a logic low which selects the parallel inputs of multiplexors 430, 930 and 940. Next, on the rising edge of clock cycle B, flop chain 1010 latches the new logic pattern [0-0].

As shown in FIGS. 11B and 12A–12D, once the new logic pattern has been latched by flop 900, a logic low is output from flop 910 while the logic high output from flop 920 continues to be output.

Since the logic state of the control signal CNTL was set to a logic high to select the output from flop 920, a logic high continues to be output from multiplexor 950 of scan flop 900. As a result, bidirectional pin 514 remains an output pin.

As further shown in FIGS. 12A–12D, at time $t_2$ the test enable signal EN rises to again select the serial inputs of the flop chain, while the test equipment latches the values on the output pins.

After this, on the rising edge of clock cycle C, the first values of the second test patterns are serially loaded into flop chain 1010, while the just latched values are serially output. Since flop 410 latched a logic zero during the parallel load on the rising edge of clock cycle B, the output from flop 900 falls to a logic low at time $t_3$.

In addition, the control signal CNTL remains at a logic high during the testing process, and falls to a logic low when testing has been completed and normal operation is to resume.

Figure 13:
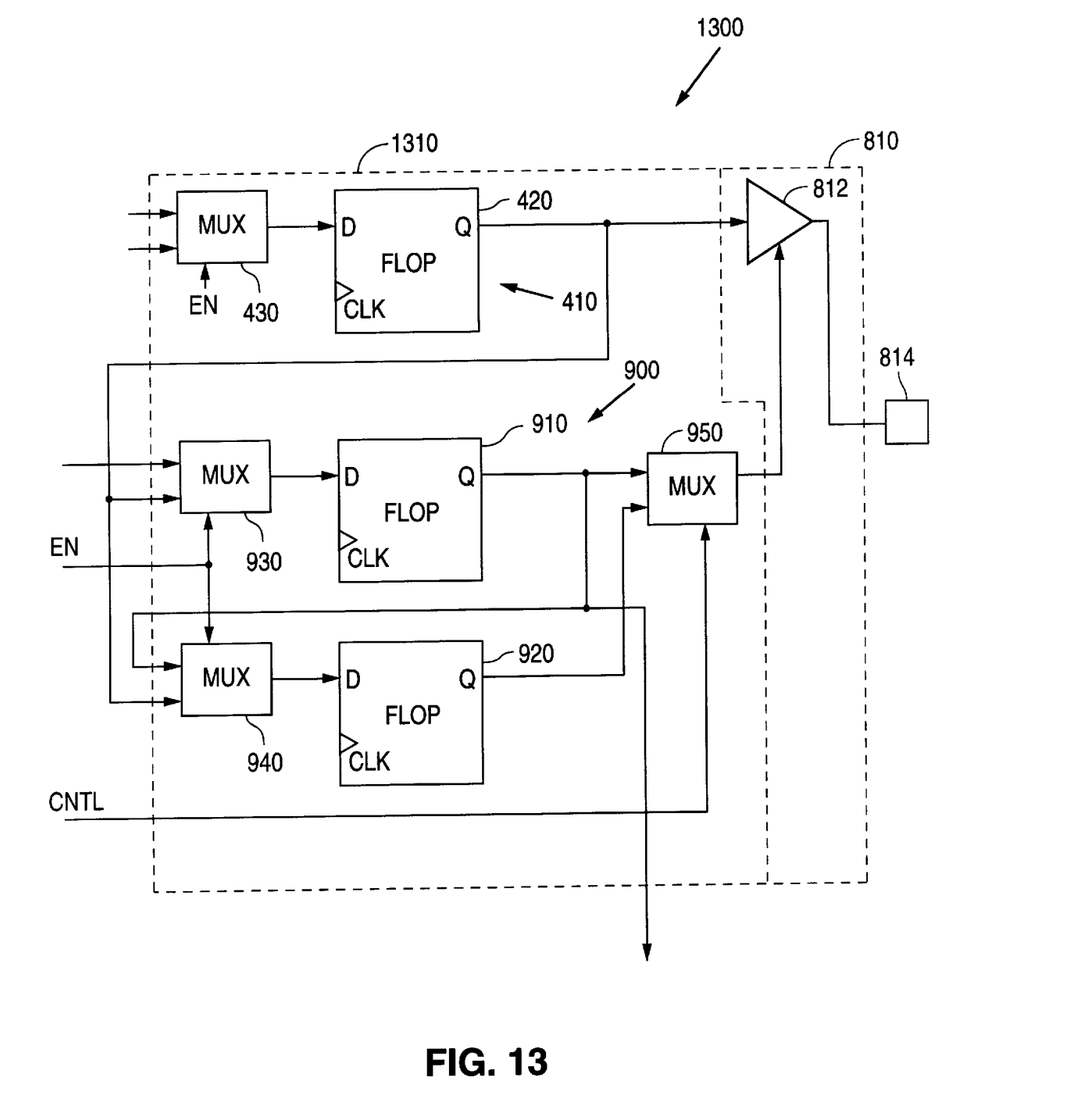
FIG. 13 is a block diagram illustrating a portion of a logic circuit 1300 in accordance with the present invention.

FIG. 13 shows a block diagram that illustrates a portion of a logic circuit 1300 in accordance with the present invention. As shown in FIG. 13, circuit 1300 includes a scan flop chain 1310, and the switchable high-impedance circuit 810 of FIG. 8 which functions as a logic subcircuit, such as subcircuit SCm of FIG. 1.

As further shown in FIG. 13, scan flop chain 1310 includes scan flop 410 of FIG. 4 which is connected to circuit 810, and scan flop 900 of FIG. 9 which is connected to scan flop 410 and circuit 810. In operation, multiplexor 950 continues to output the value that was serially loaded into latch 920 in response to a first clock signal, while the value that was loaded from the parallel inputs in response to a second clock signal is output by latch 910. Thus, driver 812 receives the same control signal throughout the parallel load clock cycle.

It should be understood that various alternatives to the embodiment of the invention described herein may be employed in practicing the invention. Thus, it is intended that the following claims define the scope of the invention and that methods and structures within the scope of these claims and their equivalents be covered thereby.

What is claimed is:

1. A scan flip-flop comprising:
   a first latch having an input and an output;
   a second latch having an input and an output;
   a first multiplexor having a serial input, a parallel input, a select input, and an output connected to the input of the first latch;
   a second multiplexor having a serial input connected to the serial input of the first multiplexor, a flop input connected to the output of the first latch, a select input connected to the select input of the first multiplexor, and an output connected to the input of the second latch; and
   a third multiplexor having an input connected to the output of the first latch, an input connected to the output of the second latch, a control input, and an output.

2. The scan flip-flop of claim 1 wherein the first latch is a D-Q flip-flop.

3. A circuit comprising:
   a scan flip-flop chain comprising:
      a first scan flip-flop including:
         a latch having an input and an output; and
         a multiplexor having a serial input, a parallel input, and an output connected to the input of the latch; and
      a second scan flip-flop including:
         a first latch having an input and an output;
         a second latch having an input and an output;
         a first multiplexor having a serial input connected to the output of the latch of the first scan flip-flop, a parallel input, a select input, and an output connected to the input of the first latch;
         a second multiplexor having a serial input connected to the serial input of the first multiplexor, a flop input connected to the output of the first latch, a select input connected to the select input of the first multiplexor, and an output connected to the input of the second latch; and
         a third multiplexor having an input connected to the output of the first latch, an input connected to the output of the second latch, a select input, and an output.

4. The circuit of claim 3 and further comprising a third scan flip-flop having:
   a latch having an input and an output; and
   a multiplexor having a serial input connected to the output of the first latch of the second scan flip-flop, a parallel input, and an output connected to the input of the latch.

5. The circuit of claim 4 and further comprising a bi-directional circuit having:
   an output driver having an input connected to the output of the latch of the first scan flip-flop, a control input, and an output;
   an input driver having an input connected to the output of the output driver, an output connected to the parallel input of the multiplexor of the third scan flip-flop, and a control input; and
   an inversion circuit connected to the output of the third multiplexor of the second scan flip-flop, and to the control inputs of the input and output drivers that assures that the input and output drivers are on at different times.

6. The circuit of claim 5 and further comprising a pad connected to the input and output drivers.

7. The circuit of claim 3 and further comprising a switchable-high impedance driver having a switchable-high impedance driver having an input connected to the output of the flop of the first scan flip-flop, an output, and a control input connected to the output of the third multiplexor of the second scan flip-flop.

8. A scan flip-flop having a serial input, a parallel input, a select input, a control input, a first output, and a second output, the scan flip-flop latching a serial-test logic state on the serial input in response to a first clock signal, and outputting the serial-test logic state on the first output, when a test enable signal on the select input selects the serial input; and latching a parallel-test logic state on the parallel input in response to a second clock signal, and outputting the parallel-test logic state on the second output when the test enable signal is switched to select the parallel input, when a control signal on the control input is in a second of two logic states.

9. The scan flip-flop of claim 8 wherein when the test enable signal is switched to select the serial input, the scan flip-flop latching a next serial-test logic state on the serial input in response to a third clock signal, and outputting the next serial-test logic state on the first output.

10. A circuit comprising:
    a scan flip-flop chain comprising:
       a first scan flip-flop having a first-flop serial input, a first-flop parallel input, a first-flop select input, and a first-flop output, the first scan flip-flop latching a serial-test logic state on the serial input in response to a first clock signal, and outputting the serial-test logic state on the output, when a test enable signal on the select input selects the serial input; and latching a parallel-test logic state on the parallel input in response to a second clock signal, and outputting the parallel-test logic state on the output, when the test enable signal selects the parallel input; and
       a second scan flip-flop having a second-flop serial input, a second-flop parallel input, a second-flop select input, a second-flop control input, a second-flop first output, and a second-flop second output, the scan flip-flop latching a serial-test logic state on second-flop serial input in response to the first clock signal, and outputting the serial-test logic state on the second-flop first output, when the test enable signal on the second-flop select input selects the second-flop serial input; and when the test enable signal is switched to select the parallel input, latching a parallel-test logic state on the parallel input in response to the next clock signal, and outputting the parallel-test logic state on the second-flop second output when a control signal on the control input is in a second of two logic states.

11. The circuit of claim 10 and further comprising a third scan flip-flop having a third-flop serial input, a third-flop parallel input, a third-flop select input, and a third-flop output, the third scan flip-flop latching a serial-test logic state on the third-flop serial input in response to the first clock signal, and outputting the serial-test logic state on the third-flop output, when the test enable signal on the third-flop select input selects the third-flop serial input; and latching a parallel-test logic state on the third-flop parallel input in response to a second clock signal, and outputting the parallel-test logic state on the third-flop output, when the test enable signal selects the third-flop parallel input.

12. The circuit of claim 11 and further comprising a bi-directional circuit having:
    an output driver having an input connected to the first-flop output, a control input, and an output;

an input driver having an input connected to the output of the output driver, an output connected to the third-flop parallel input; and an inversion circuit connected to the second-flop first output that assures that the input and output drivers are on at different times.

13. The circuit of claim 10 and further comprising a switchable-high impedance circuit having an input connected to the first-flop output, an output, and a control input connected to the second-flop first output.

14. A method of operating a scan flip-flop having a serial input, a parallel input, a select input, a control input, a first output, and a second output, the method comprising the steps of:

latching a serial-test logic state on the serial input in response to a clock signal, and outputting the serial-test logic state on the first output, when a test enable signal on the select input selects the serial input; and latching a parallel-test logic state on the parallel input in response to a next clock signal, and outputting the parallel-test logic state on the second output, when the test enable signal is switched to select the parallel input, and a control signal on the control input is in a second of two logic states so that the serial-test logic state and the parallel-test logic state are both output during the same time.

15. A method for operating a scan flip-flop chain, the chain having:

a first scan flip-flop having a first-flop serial input, a first-flop parallel input, a first-flop select input, and a first-flop output, a second scan flip-flop having a second-flop serial input, a second-flop parallel input, a second-flop select input, a second-flop control input, a second-flop first output, and a second-flop second output, the method comprising the steps of:

latching a serial-test logic state on the serial input in response to a first clock signal, and outputting the serial-test logic state on the output, when a test enable signal on the select input selects the serial input; and latching a parallel-test logic state on the parallel input in response to a second clock signal, and outputting the parallel-test logic state on the output, when the test enable signal selects the parallel input; and latching a serial-test logic state on second-flop serial input in response to the first clock signal, and outputting the serial-test logic state on the second-flop first output, when the test enable signal on the second-flop select input selects the second-flop serial input; and latching a parallel-test logic state on the parallel input in response to the next clock signal, and outputting the parallel-test logic state on the second-flop second output when the test enable signal is switched to select the parallel input, and a control signal on the control input is in a second of two logic states.

* * * * *